US010701800B2

(12) United States Patent
Nguyen et al.

(10) Patent No.: US 10,701,800 B2
(45) Date of Patent: Jun. 30, 2020

(54) PRINTED CIRCUIT BOARDS

(71) Applicant: Hewlett Packard Enterprise Development LP, Houston, TX (US)

(72) Inventors: Vincent Nguyen, Houston, TX (US); Sung Hsia Kuo, Houston, TX (US); Ho M Lai, Spring, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 16/065,435

(22) PCT Filed: Jan. 28, 2016

(86) PCT No.: PCT/US2016/015324
§ 371 (c)(1),
(2) Date: Jun. 22, 2018

(87) PCT Pub. No.: WO2017/131694
PCT Pub. Date: Aug. 3, 2017

(65) Prior Publication Data
US 2019/0008031 A1    Jan. 3, 2019

(51) Int. Cl.
H05K 7/00       (2006.01)
H05K 1/02       (2006.01)
(Continued)

(52) U.S. Cl.
CPC ........... *H05K 1/029* (2013.01); *H05K 1/0295* (2013.01); *H05K 1/115* (2013.01); *H05K 1/181* (2013.01);
(Continued)

(58) Field of Classification Search
None
See application file for complete search history.

(56) References Cited

U.S. PATENT DOCUMENTS 5,640,761 A * 6/1997 DiStefano ........... H01L 21/4857
174/262
6,224,396 B1 * 5/2001 Chan ..................... H05K 3/325
439/66

(Continued)

OTHER PUBLICATIONS

An Active Reconfigurable Circuit Board.
International Search Report and Written Opinion, dated Oct. 27, 2016, PCT/US2016/015324, 13 pages.

*Primary Examiner* — Courtney L Smith
*Assistant Examiner* — Rashen E Morrison
(74) *Attorney, Agent, or Firm* — Park, Vaughan, Fleming & Dowler LLP

(57) ABSTRACT

An example method includes linking a transmit line and receive line to a respective via, and printing two paths to each via, wherein each path is interrupted by two pairs of contacts. When a first resistor is in a first pair of contacts at a receive via, first signal is formed between a receive point of a first connector and the receive line. When a first capacitor is in first pair of contacts at a transmit via, second signal is formed between transmit point of first connector and the transmit line. When a second resistor is in second pair of contacts at receive via, third signal is formed between receive point of a second connector and the receive line. When a second capacitor is in second pair of contacts at transmit via, fourth signal is formed between a transmit point of second connector and the transmit line.

4 Claims, 4 Drawing Sheets

(51) Int. Cl.
  *H05K 1/11* (2006.01)
  *H05K 1/18* (2006.01)
  *H05K 3/12* (2006.01)
  *H05K 1/16* (2006.01)

(52) U.S. Cl.
  CPC ............... *H05K 1/184* (2013.01); *H05K 3/12* (2013.01); *H05K 1/0243* (2013.01); *H05K 1/162* (2013.01); *H05K 1/167* (2013.01); *H05K 7/00* (2013.01); *H05K 2201/10015* (2013.01); *H05K 2201/10022* (2013.01); *H05K 2201/10189* (2013.01); *H05K 2201/10734* (2013.01)

(56) References Cited

U.S. PATENT DOCUMENTS

| | | | |
|---|---|---|---|
| 6,246,247 B1 * | 6/2001 | Eldridge | B23K 20/004 |
| | | | 257/E21.507 |
| 6,324,610 B1 | 11/2001 | Lord et al. | |
| 6,463,554 B1 * | 10/2002 | Budelman | G06F 11/004 |
| | | | 714/43 |
| 7,002,428 B2 * | 2/2006 | McMorrow | H04B 3/04 |
| | | | 333/20 |
| 7,129,902 B2 | 10/2006 | Bancroft | |
| 7,362,589 B2 | 4/2008 | Gay | |
| 7,978,030 B2 * | 7/2011 | Lee | H01P 5/028 |
| | | | 333/247 |
| 8,423,695 B2 | 4/2013 | Purwin | |
| 2002/0053734 A1 * | 5/2002 | Eldridge | B23K 20/004 |
| | | | 257/724 |
| 2003/0169121 A1 * | 9/2003 | Grebenkemper | H05K 1/0234 |
| | | | 333/12 |
| 2003/0181075 A1 * | 9/2003 | Hartke | H05K 1/141 |
| | | | 439/67 |
| 2006/0078248 A1 * | 4/2006 | Sasaki | G02B 6/4214 |
| | | | 385/14 |
| 2007/0222536 A1 | 9/2007 | Yang | |
| 2008/0296697 A1 * | 12/2008 | Hsu | H01L 21/76886 |
| | | | 257/379 |
| 2011/0011634 A1 | 1/2011 | Moldauer | |
| 2011/0119425 A1 * | 5/2011 | Kollipara | G06F 13/1668 |
| | | | 710/307 |
| 2012/0061853 A1 * | 3/2012 | Su | H01L 21/563 |
| | | | 257/778 |
| 2013/0003310 A1 * | 1/2013 | Raj | H05K 7/1092 |
| | | | 361/718 |
| 2013/0188306 A1 | 7/2013 | Park | |
| 2013/0258627 A1 * | 10/2013 | Guo | H01L 23/147 |
| | | | 361/782 |
| 2013/0279135 A1 | 10/2013 | Isono | |
| 2014/0184361 A1 | 7/2014 | Kato | |
| 2015/0313017 A1 * | 10/2015 | Johnson | G06F 1/32 |
| | | | 174/262 |
| 2016/0259738 A1 * | 9/2016 | Johnson | G06F 1/32 |

* cited by examiner

PRINTED CIRCUIT BOARDS

BACKGROUND

Printed circuit boards (PCB) mechanically supports and electrically connects electronic components using conducting tracks, pads, and other features etched from copper sheets laminated onto non-conductive substrates. Conducting paths may connect components together such as a processor with a connector, which may connect to other devices. Furthermore, some PCBs may contain components embedded in the substrate, such as capacitors, resistors, or active devices.

BRIEF DESCRIPTION OF THE DRAWINGS

The following detailed description references the drawings, wherein.

DETAILED DESCRIPTION

Figure 1:
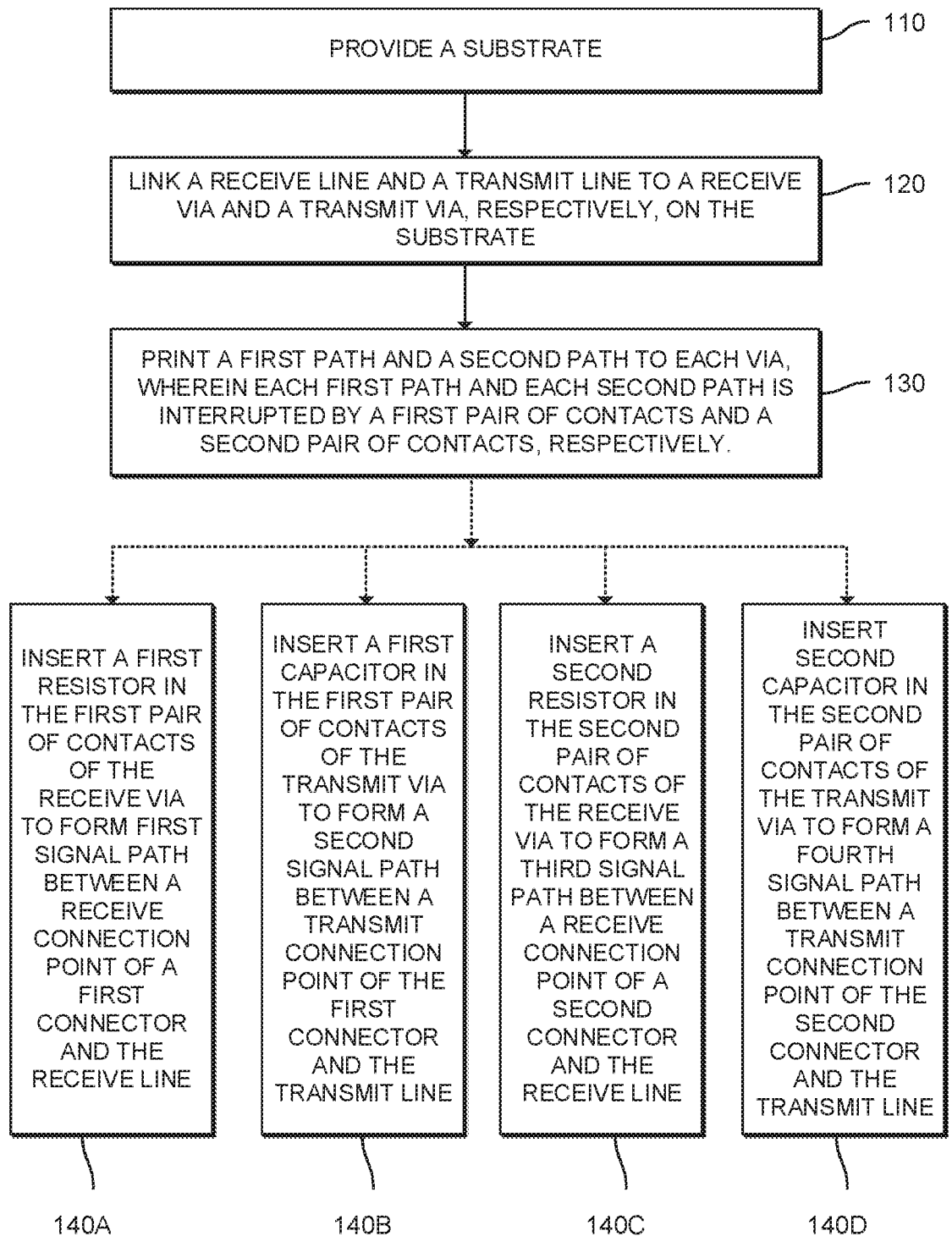
FIG. 1 is a flow diagram of an example method for manufacturing a printed circuit board.

The following detailed description refers to the accompanying drawings. Wherever possible, the same reference numbers are used in the drawings and the following description to refer to the same or similar parts. While several examples are described in this document, modifications, adaptations, and other implementations are possible. Accordingly, the following detailed description does not limit the disclosed examples. Instead, the proper scope of the disclosed examples may be defined by the appended claims.

With the rapid growth in the use of computers to host business applications, websites, cloud, etc., the complexity and power of computing components have also multiplied. In prevailing computer architectures, printed circuit boards (PCB) mechanically supports and electrically connects electronic components using conductive tracks, pads, and other features etched from copper sheets laminated onto an insulating substrate. PCBs are typically designed and mass-manufactured. In some instances, different components may have different design and structural requirements. As a result, some components may not easily share a common PCB design.

Examples disclosed herein address these technical challenges by providing for PCB layouts and methods of manufacturing such layouts for high speed input/output signals that enable devices with different configurations to share a common printed circuit board design. An example method of manufacturing a PCB may include linking a transmit line and a receive line to two different vias, receive via and transmit via, respectively, in a substrate and printing a first path and a second path to each via where each first path and second path are interrupted by a first pair of contacts and a second pair of contacts, respectively.

When a first resistor is coupled to the first pair of contacts of the receive via, a first signal path is formed between a receive connection point of a first connector and the receive line. When a first capacitor is inserted in the first pair of contacts of the transmit via, a second signal path is formed between a transmit connection of point of the first connector and the transmit line. When a second resistor is inserted in the second pair of contacts of the receive via, a third signal path is formed between a receive connection point of a second connector and the receive line. When a second capacitor is inserted in the second pair of contacts of the transmit via, a fourth signal path is formed between a transmit connection point of the second connector and the transmit line. In such manner, example PCB path layouts may allow for compatibility with a duality of connectors based on the placement of a resistor and a capacitor on either the first pair of contacts or the second pair of contacts.

Referring now to the drawings, FIG. 1 depicts an example method 100 for manufacturing a printed circuit board (PCB). As to be described herein, a printed circuit board may be a mechanical support that electrically connects electronic components using conductive pathways, which may be referred to PCB paths, between different electronic components and between the printed circuit board and electronic components. For example, a PCB may be a motherboard or some other type of structure. In some implementations, a PCB may have conductive tracks, pads, and other features etched from copper sheets laminated onto a non-conductive substrate. A printed circuit board may be planar in configuration, having, for example, a top layer and a bottom layer. In some instances, a printed circuit board may also be referred to as printed wiring board, etched wiring board, printed circuit assembly, printed circuit board assembly, circuit card assembly, or backplane assembly.

In an operation 110, a substrate may be provided. A substrate may have an electrically insulating material that maintains the electrical integrity of the various components and lines on the PCB. A substrate may be any mechanically robust and electrically insulating material, including mechanical structures or air. For example, substrate materials may include silicon, oxides, alloys, and other compound materials. In some examples, glass epoxy, such as FR-4, may be the primary substrate material. Thin layers of copper foil may be laminated to one or various sides of a substrate panel. Circuitry interconnections may be etched into copper layers. Furthermore in some examples, a substrate may have multiple layers of material. For example, some example complex circuits may be produced in multiple layers. A substrate may serve as the foundation for other components of the PCB, as described herein.

In an operation 120, a receive line and a transmit line is linked to a receive via and a transmit via, respectively in the substrate provided in operation 110. The receive line and the transmit line may be input/output circuitry that may be communicating paths that feed electrical current or other electrical signals. The receive line and the transmit line may be formed by copper wiring on or in a PCB. As explained herein, in a process commonly referred to as printing, the receive line and the transmit line may be etched into copper layers deposited onto a PCB substrate. In some examples, the receive line and the transmit line may be printed in internal layers of the PCB substrate. Alternatively, the receive line and the transmit line may be on surfaces of the substrate.

A via may be an electrical connection between layers in a physical electronic circuit, such as layers of a PCB, that goes through the plane of one or more adjacent layers. A via may connect, for example, two faces of a PCB. A via may have a conductive tube, or barrel, that fills a hole through the plane of the PCB. Lines of the PCB may be linked to the vias by various methods, including by conducting pads.

As part of operation 120 or in a separate operation, the receive line and the transmit line may, in some examples, be linked to a receive connection point of a processor and a transmit connection point of the processor, respectively. For example, the other ends of the receive line and transmit line may link to their respective connection points. The receive line and the transmit line may link to vias which connect with the processor or, alternatively, they may directly link with conducting pads of the processor.

In an operation 130, a first path and a second path is linked to each via. Each first path may be interrupted by a first pair of contacts and each second path may be interrupted by a second pair of contacts. The contacts may be conducting pads that, as a pair, form a gap in the paths. Electrically connecting a pair of contacts may form a conducting path for a signal.

In some examples, the first path of one via may be printed on a first face of a substrate, and the second path of the one via may be printed on a second face of the substrate. In such an example, the first path of the other via may be printed on the second face of the substrate, and the second path of the other via may be printed on the first face of the substrate. A first and second face of a substrate may be top or bottom layer of a planar wafer. The describers top and bottom are merely to distinct surfaces of the substrate, and are not limiting in orientation.

As illustrated in an operation 140A a first resistor is coupled to the first pair of contacts of the receive via, a first signal path is formed between a receive connection point of a first connector and the receive line. For example, the first path of the receive via may link the receive connection point of the first connector to the receive via, which in turn links to the receive line. Doing so may facilitate the formation of a receive path between a processor, which may be linked to the receive line by the receive connection point of the processor, and the first connector, which may be linked to the first path by the receive connection point of the first connector.

As used herein, a connector may be a device or configuration of devices that facilitate communication with other components or devices. For example, a connector may be a computer expansion bus that can be used to transfer data. A connector may include various hardware components such as wires, optical fiber, and various structures, and software, including communication protocols. Connectors may be any arrangement that provides the desired functionality, including parallel and bit serial connections, and can be wired in either multidrop or daisy chain topology, or connected by switched hubs.

As illustrated in an operation 140B, when a first capacitor is inserted in the first pair of contacts of the transmit via, a second signal path is formed between a transmit connection of point of the first connector and the transmit line. For example, the first path of the transmit via may link the transmit connection point of the first connector to the transmit via, which in turn links to the transmit line. Doing so may facilitate the formation of a transmit path between a processor, which may be linked to the transmit line by the transmit connection point of the processor, and the first connector, which may be linked to the first path by the transmit connection point of the first connector.

As illustrated in an operation 140C, when a second resistor is inserted in the second pair of contacts of the receive via, a third signal path is formed between a receive connection point of a second connector and the receive line. For example, the second path of the receive via may link the receive connection point of the second connector to the receive via, which in turn links to the receive line. Doing so may facilitate the formation of a receive path between a processor, which may be linked to the receive line by the receive connection point of the processor, and the second connector, which may be linked to the second path by the receive connection point of the second connector.

As illustrated in an operation 140D, when a second capacitor is inserted in the second pair of contacts of the transmit via, a fourth signal path is formed between a transmit connection point of the second connector and the transmit line. For example, the second path of the transmit via may link the transmit connection point of the second connector to the transmit via, which in turn links to the transmit line. Doing so may facilitate the formation of a transmit path between a processor, which may be linked to the transmit line by the transmit connection point of the processor, and the second connector, which may be linked to the second path by the transmit connection point of the second connector.

In such a manner, a set of transmit and receive lines and two sets of first and second paths together may accommodate at least two types of connectors, such as the first connector and the second connector. For example, the first connector may be a through-hole Peripheral Component Interconnect Express (PCIe) serial expansion bus. On the other hand, the second connector may be a surface-mounted PCIe serial expansion bus. In some examples, PCIe buses may facilitate connecting a computer to one or more peripheral or expansion devices. The ability to accommodate multiple connectors on the same PCB path layout is facilitated by the configuration of the first lines and second lines, as explained herein.

Alternatively in some examples, the first connector may be for a first embedded device and the second connector may be for a second embedded device. An embedded device may be discrete computing components or devices that are embedded, installed, or otherwise located directly on the PCB. Embedded device may include simple components to complex devices and modules, including memories, circuitry, and other processors.

Figure 2A:
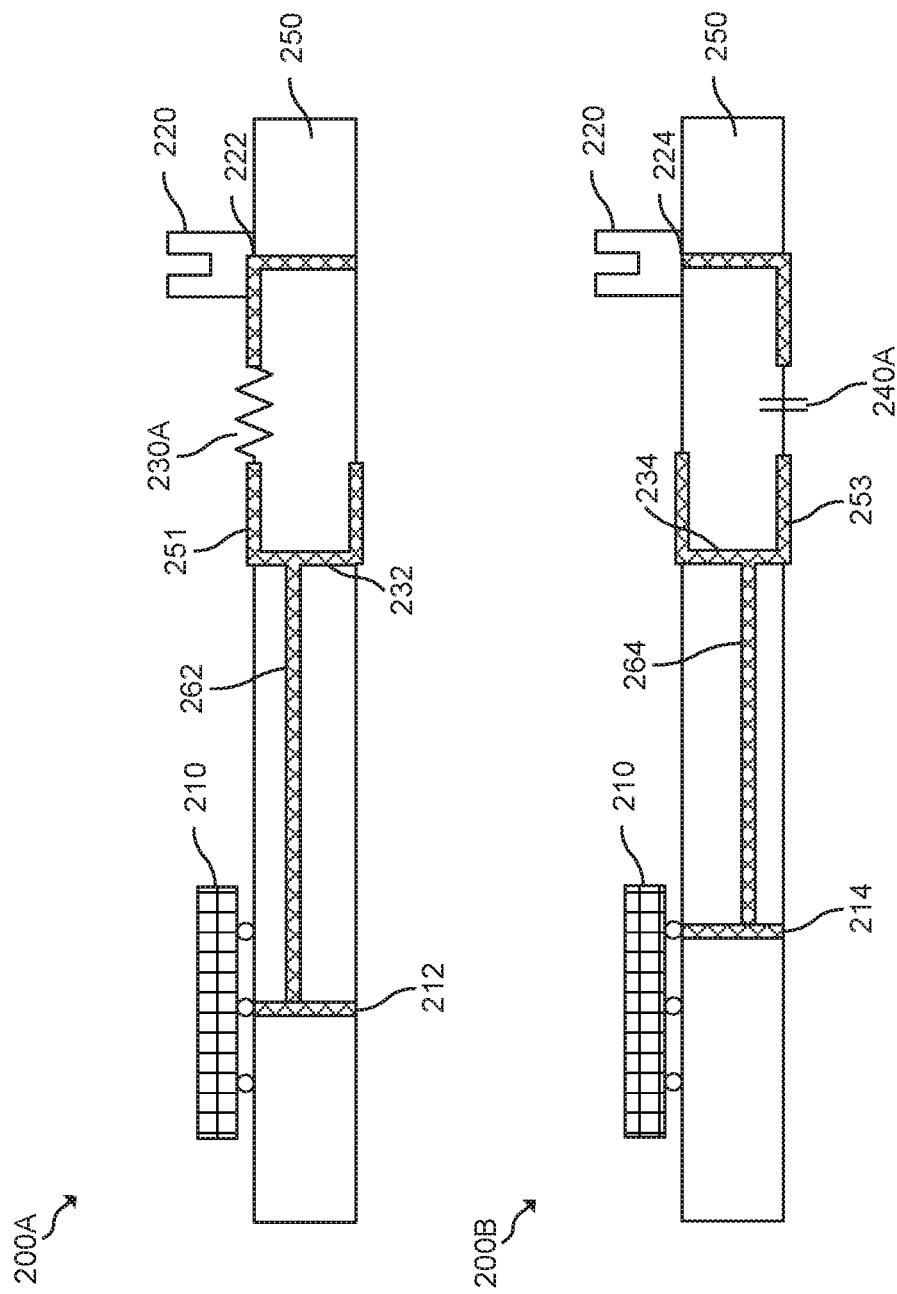
FIG. 2A is a schematic diagram of an example printed circuit board layout for a first connector.

FIG. 2A depicts an example printed circuit board (PCB) (i.e., a PCB 200A and a PCB 200B) for a first connector. For example, the connector may be a through-hole PCIe connector 220. FIG. 2A illustrates PCB 200A with a receiving path for through-hole PCIe connector 220 and PCB 200B with a transmitting path for through-hole PCIe connector 220.

As shown, the example PCB 200A and PCB 200B may have a substrate 250. PCB 200A and PCB 200B may be, for example, a motherboard or other form of circuit board. Substrate 250 may provide mechanical support to PCB 200A and PCB 200B. In examples herein, a substrate may have an electrically insulating material that maintains the electrical integrity of the various components and lines on the PCB. A substrate may be any mechanically robust and electrically insulating material, including mechanical structures or air.

For example, substrate 250 may serve as the foundation for the other components of PCB 200A and PCB 200B, including but not limited to processor 210, processor receive connection point 212, processor transmit connection point 214, receive line 262, transmit line 264, receive via 232, transmit via 234, first receive path 251 of the receive via, first transmit path 253 of the transmit via, first receive pair of contacts 230A of the first receive path, first transmit pair of contacts 240A of the first transmit path, through-hole PCIe connector 220, connector receive connection point 222, and connector transmit connection point 224. Substrate 250 may have an electrically insulating material that maintains the electrical integrity of the various components and lines on PCB 200A and PCB 200B. In some examples, glass epoxy, such as FR-4, may be the primary material. During production, thin layers of copper foil may be laminated to one or various sides of substrate 250. Circuitry interconnections, such as the paths, may be etched into the copper layers.

Processor 210 may be linked by receive connection point 212, such as a via to a solder point as shown in FIG. 2A. Processor 210 may also be similarly linked by transmit connection point 214. Processor 210 may be one or more central processing units (CPUs), semiconductor-based microprocessors, and/or other hardware devices suitable for retrieval and execution of instructions for operations of a computing device, for example the basic arithmetic, logical, control, and input/output operations. As an alternative or in addition to retrieving and executing instructions, processor 210 may include one or more electronic circuits that include electronic components for performing the functionality of a computing device. In some examples, processor 210 may not be a CPU but various other processing units, such as graphic processing units, etc.

Receive line 262 and transmit line 264 may respectively link processor receive connection point 212 and processor transmit connection point 214 to receive via 232 and transmit via 234. In some examples, such as the one illustrated in FIG. 2A, receive line 262 and transmit line 264 may be in separate internal layers of the PCB 250.

First receive path 251 and first transmit path 253 may be etched into copper layers deposited onto substrate 250, and may link to receive connection point 222 of connector 220 and transmit connection point 224 of connector 220, respectively. In some examples, first receive path 251 may be located on a top face of substrate 250. Accordingly, first transmit path 253 may be located on a bottom face of substrate 250. Such an arrangement may allow easy distinction between the two paths.

For example, first receive path 251 may serve as a receiving path between through-hole PCIe connector 220 and processor 210 by having a first resistor coupled in a first receive pair of contacts 230A of the first receive path 251. Similarly, first transmit path 253 may serve as a transmitting path between through-hole PCIe connector 220 and processor 210 by having a first capacitor coupled in a first transmit pair of contacts 240A of first transmit path 253.

Figure 2B:
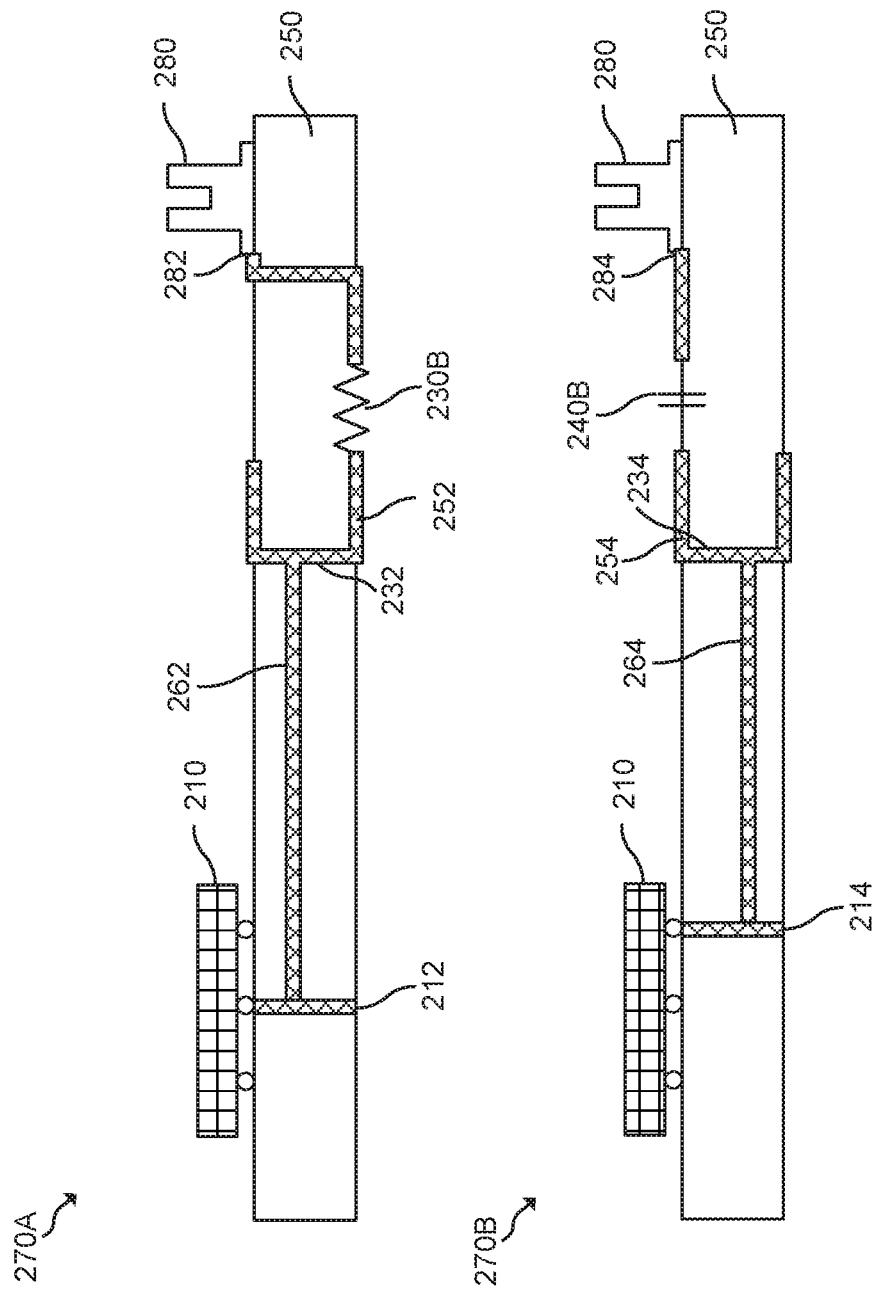
FIG. 2B is a schematic diagram of an example printed circuit board layout for a second connector.

FIG. 2B depicts an example printed circuit board (PCB) (i.e., a PCB 270A and a PCB 270B) for a second connector. For example, the connector may be surface-mounted PCIe connector 280. FIG. 2B illustrates PCB 270A with a receiving path for the second connector and PCB 270B with a transmitting path for the second connector.

As shown, the example PCB layout of PCB 270A and PCB 270B may be formed on a printed circuit board with substrate 250. PCB 270A and PCB 270B may be, for example, a motherboard or other form of circuit board. Substrate 250 may provide mechanical support. As described previously in relation to FIG. 2A, substrate 250 may serve as the foundation for the other components of PCB 270A and 270B, including but not limited to processor 210, processor receive connection point 212, processor transmit connection point 214, receive line 262, transmit line 264, receive via 232, transmit via 234, second receive path 252, second transmit path 254, second receive pair of contacts 230B, second transmit pair of contacts 240B, surface-mounted PCIe connector 280, connector receive connection point 282, and connector transmit connection point 284. Substrate 250 may have an electrically insulating material that maintains the electrical integrity of the various components and lines on PCB 270A and PCB 270B. In some examples, glass epoxy, such as FR-4, may be the primary material. During production, thin layers of copper foil may be laminated to one or various sides of substrate 250. Circuitry interconnections, such as the paths, may be etched into the copper layers.

Processor 210 may be linked by receive connection point 212, such as a via to a solder point as shown in FIG. 2B. Processor 210 may also be similarly linked by transmit connection point 214. Receive line 262 and transmit line 264 may respectively link processor receive connection point 212 and transmit connection point 214 to receive via 232 and transmit via 234. In some examples, such as the one illustrated in FIG. 2B, receive line 262 and transmit line 264 may be in separate internal layers of substrate 250.

Second receive path 252 and second transmit path 254 may be etched into copper layers deposited onto substrate 250, and may link to receive connection point 282 of connector 280 and transmit connection point 284 of connector 280, respectively. In some examples, second receive path 252 may be located on a bottom face of substrate 250. Accordingly, second transmit path 254 may be located on a top face of substrate 250. Such an arrangement may allow easy distinction between the two paths.

For example, second receive path 252 may serve as a receiving path between surface-mounted PCIe connector 280 and processor 210 by having a second resistor coupled in the second receive pair of contacts 230B of the second receive path 252. Similarly, second transmit path 254 may serve as a transmitting path between surface-mount PCIe connector 280 and processor 210 by having a second capacitor coupled in a second transmit pair of contacts 240B of second transmit path 254.

The example PCB path layout described above may allow for a duality of configurations based on the placement of a resistor and a capacitor on either first paths or second paths. This may facilitate versatile use of a single PCB design for multiple device structural requirements.

Figure 3:
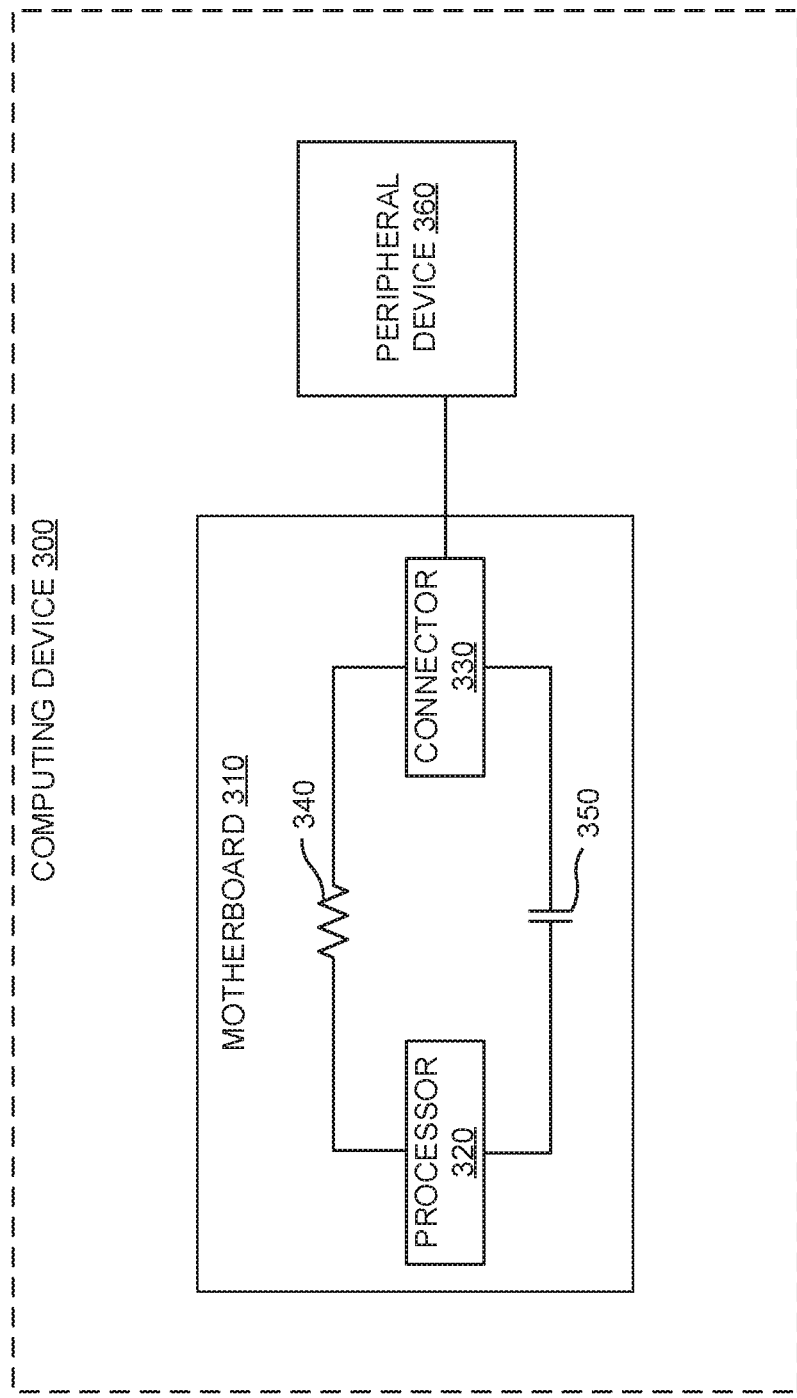
FIG. 3 is a schematic block diagram of an example computing device having a motherboard with example PCB path layouts.

FIG. 3 depicts a block diagram of an example computing device 300 having a motherboard 310 with an example PCB layouts as described herein. Computing device 300 may be, for example, a cloud server, a local area network server, a web server, a mainframe, a mobile computing device, a notebook or desktop computer, a smart TV, a point-of-sale device, a wearable device, any other suitable electronic device, or a combination of devices, such as ones connected by a cloud or internet network, that may have computing components supported on motherboard 310. In the example shown in FIG. 3, computing device 300 includes motherboard 310 connected to a peripheral device 360.

Motherboard 310 may be a main printed circuit board in computing device 300. Motherboard 310 may hold and allow communication between electronic components of computing device 300, such as a processor 320, connector 330, and other components such as memories. Motherboard 310 may be expandable, and various components may either be hosted directly on the motherboard or may be connected by connections such as connector 330. Examples of other components include sound cards, video cards, network cards, hard drives, television tuner cards, universal serial bus cards, and other custom components, such as controlling boards in various electronic devices and other embedded systems.

Motherboard 310 may have a path layout that may allow for a duality of configurations based on the placement of a resistor 340 and capacitor 350 on either a first path or a second path, which link processor 320 with connector 330. For example, in a first configuration for a first type of connector 330, resistor 340 is in series with the first path to form a receiving path for the first connector, and capacitor 350 is in series with the second path to form a transmitting path for the first connector. In a second configuration for a second type of connector 330, resistor 340 is in series with the second path to form a receiving path for the second connector, and capacitor 350 is in series with the first path to form a transmitting path for the second connector.

The first configuration and the second configuration may refer to two different structures of connector 330. For example, the first configuration may be for a through-hole Peripheral Component Interconnect Express (PCIe) serial expansion bus. The second configuration may be for a surface-mounted PCIe serial expansion bus.

Connector 330 may connect motherboard 310 with a peripheral device 360. Peripheral device 360 may be any component or device that may be connected to motherboard 310 via connector 330. For example, peripheral device 360 may be processors, memories, sound cards, network cards, video cards, and the like. In other examples, peripheral device 360 may include input and output user devices, including, for example, keyboards, mice, touchscreens, monitors, printers, etc. Generally, peripheral device 360 may be any auxiliary device that may either be a part of computing device 300 or a separate computing component.

The foregoing disclosure describes a number of example embodiments for printed circuit boards. The disclosed examples may include systems, devices, and methods relating to the PCB. For purposes of explanation, certain examples are described with reference to the components illustrated in FIGS. 1-3. The functionality of the illustrated components may overlap, however, and may be present in a fewer or greater number of elements and components. All or part of the functionality of illustrated elements may co-exist or be distributed among several geographically dispersed locations. Moreover, the disclosed examples may be implemented in various environments and are not limited to the illustrated implementations.

Further, the sequence of operations described in connection with FIGS. 1-3 are examples and are not intended to be limiting. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples. All such modifications and variations are intended to be included within the scope of this disclosure and protected by the following claims.

What is claimed is:

1. A printed circuit board (PCB), comprising:
   a substrate;
   a receive line and a transmit line linking to a receive via and a transmit via, respectively, in the substrate; and
   a first path and a second path connected to each via, wherein each first path and second path is interrupted by a first pair of contacts and a second pair of contacts, respectively, wherein
   the transmit line and the receive line are in internal layers of the substrate, the first path connected to the receive via is printed on a first face of the substrate, the first path connected to the transmit via is printed on a second face, the second path connected to the receive via is printed on the second face, and the second path connected to the transmit via is printed on the first face;
   when a first resistor is coupled to the first pair of contacts of the receive via, a first signal path is formed between a receive connection point of a first connector and the receive line;
   when a first capacitor is inserted in the first pair of contacts of the transmit via, a second signal path is formed between a transmit connection of point of the first connector and the transmit line;
   when a second resistor is inserted in the second pair of contacts of the receive via, a third signal path is formed between a receive connection point of a second connector and the receive line; and
   when a second capacitor is inserted in the second pair of contacts of the transmit via, a fourth signal path is formed between a transmit connection point of the second connector and the transmit line.

2. The PCB of claim 1, wherein the first connector is a through-hole PCIe connector, and the second connector is a surface-mounted PCIe connector.

3. The PCB of claim 1, wherein the transmit line and the receive line link to a transmit connection point of a processor and a receive connection point of the processor, respectively.

4. The PCB of claim 1, wherein the first connector is a connector for a first embedded device, and the second connector is a connector for a second embedded device.

* * * * *